United States Patent
Pantůček et al.

(10) Patent No.: US 7,218,154 B1
(45) Date of Patent: May 15, 2007

(54) TRACK AND HOLD CIRCUIT WITH OPERATING POINT SENSITIVE CURRENT MODE BASED OFFSET COMPENSATION

(75) Inventors: Luděk Pantůček, Brno-Sever (CZ); Petr Kamenický, Brno (CZ)

(73) Assignee: AMI Semiconductor, Inc., Pocatello, ID (US)

( * ) Notice: Subject to any disclaimer, the term of this patent is extended or adjusted under 35 U.S.C. 154(b) by 253 days.

(21) Appl. No.: 11/094,945

(22) Filed: Mar. 31, 2005

(51) Int. Cl.
*G11C 27/02* (2006.01)
*H03K 5/00* (2006.01)

(52) U.S. Cl. .......................... 327/94; 327/95
(58) Field of Classification Search ............... 327/91, 327/94, 95; 341/122
See application file for complete search history.

(56) References Cited

U.S. PATENT DOCUMENTS

| | | | | |
|---|---|---|---|---|
| 3,516,002 A | * | 6/1970 | Hillis | 330/51 |
| 4,142,117 A | * | 2/1979 | Chang | 327/94 |
| 4,445,093 A | * | 4/1984 | Kohler | 327/58 |
| 4,570,080 A | * | 2/1986 | Swanson | 327/95 |
| 4,691,125 A | | 9/1987 | Rybicki | 307/353 |
| 4,962,325 A | * | 10/1990 | Miller et al. | 327/95 |
| 5,081,372 A | * | 1/1992 | Pelgrom | 327/95 |
| 5,506,526 A | | 4/1996 | Seesink | 327/91 |
| 6,608,504 B2 | * | 8/2003 | Fujimoto | 327/94 |

OTHER PUBLICATIONS

"A 10-bit Video BiCMOS Track-and-Hold Amplifier" Mehrdad Nayebi and Bruce A. Wooley IEEE Journal of Solid-State Circuits, vol. 24, No. 6, Dec. 1989.
"An Accurate CMOS Sample-and-Hold Circuit" U. Gattl, F. Maloberti, and G. Palmisano IEEE Journal of Solid State Circuits, vol. 27, No. 1, Jan. 1992.

* cited by examiner

*Primary Examiner*—Quan Tra
*Assistant Examiner*—Rey Aranda
(74) *Attorney, Agent, or Firm*—Workman Nydegger

(57) ABSTRACT

A track and hold (or sample and hold) offset compensated amplifier circuit that performs offset compensation in response to a comparison of sign (or sign and value) of the current forced to the output terminal of operational amplifier in order to keep it at the potential of holding capacitor during the holding phase. Based on this comparison, the comparison circuit increases or decreases the voltage differential applied between the positive and negative input terminals of the operational amplifier depending on whether the comparison circuit detects that the current forced to the output terminal of the operational amplifier is positive or negative. During the holding phase, negative feedback is disconnected, and the positive and negative input terminals of the operational amplifier are connected.

9 Claims, 3 Drawing Sheets

TRACK AND HOLD CIRCUIT WITH OPERATING POINT SENSITIVE CURRENT MODE BASED OFFSET COMPENSATION

BACKGROUND OF THE INVENTION

1. The Field of the Invention

The present invention relates generally to offset compensated amplifier structures operating in track and hold or sample and hold mode (hereinafter referred to collectively as "track and hold", that perform offset compensation during the holding phase.

2. Background and Relevant Art

The track and hold circuit is a key building block for circuit designers. Track and hold circuits receive an analog signal that may vary over time. The track and hold circuit operates in two phases, a tracking phase and a holding phase. During the tracking phase, the output of the track and hold circuit approximately tracks the input signal of the circuit. During the holding phase, the circuit outputs a constant value that represents the strength of the input analog signal at a particular instant in time.

FIG. 6 illustrates a track and hold circuit 600 in accordance with the prior art. During the tracking phase, switch 603 is closed. In this closed loop configuration, each of the operational amplifiers 601 and 602 has unity gain. Thus, the output voltage $V_{OUT}$ tracks the voltage provided at the positive input terminal of the operational amplifier 602, which tracks the input voltage provided to the positive input terminal of the operational amplifier 601.

At the transition from the tracking phase to the holding phase, the switch 603 is opened, thereby isolating charge stored at the upper terminal of the holding capacitor 604. In this configuration, the voltage at the positive input terminal of operational amplifier 602 is held constant. The operational amplifier 602 is still in unity gain configuration and thus the held voltage is provided as the output voltage $V_{OUT}$ of the track and hold circuit 600.

Also during the holding phase, the held output voltage $V_{OUT}$ is provided to the negative input terminal of operational amplifier 601. The operational amplifier 601 is now in open loop configuration and thus has a high gain. In this open loop configuration, even if the voltage $V_{IN}$ is constant and identical to the held voltage $V_{OUT}$, the inherent input offset of the operational amplifier 601 will result in large variances in the voltage at the output terminal of the operational amplifier 601. Often, the output voltage may even saturate to either the negative supply voltage or the positive supply voltage.

Accordingly, a large voltage differential may develop across the switch 603 during the holding phase. When the switch is closed at the transition from the holding phase to the next tracking phase, a rather significant amount of charge redistribution will occur across the switch 603. This is reflected through the unity gain operational amplifier 602 as rippling on the output voltage $V_{OUT}$. This rippling degrades output signal quality and may cause unwanted Electro-Magnetic Interference (EMI), which could affect the performance of surrounding circuitry. Furthermore, in order to obtain accurate tracking, this rippling should be eliminated as much as possible. In order not to disturb the next holding phase, the rippling should settle within certain tolerances before the next holding phase begins. This settling time may result in inaccuracies and delays, thereby adversely impacting the circuit's primary function, and slowing the operation of the track and hold circuit for a given level of accuracy and resolution.

In order to increase the accuracy of the input voltage tracking and the accuracy of the voltage held during the holding phase, many conventional track and hold amplifiers employ offset compensation circuitry that compensates for the offset problems in the input operational amplifier. Typically the offset compensation of the input operational amplifier 601 is done by disconnect its negative input terminal from output node $V_{OUT}$. The terminal is then connected to the input voltage node $V_{IN}$, thus realizing a short between the input terminals of operational amplifier 601. The offset of this input operational amplifier is thus amplified with open loop gain of 601 to its output, where amplified offset information is processed by an analog or digital offset compensating feedback loop. Such conventional sample and hold circuits still develop large voltage differentials across the switch 603 during the holding phase, causing rippling of output voltage $V_{OUT}$ at the transitions between the holding and the tracking phase. To reduce this rippling, such circuits may, for example, clamp the output terminal of the input operational amplifier to a particular voltage during the holding phase. Nevertheless, there may still be some significant voltage differential across the switch 603 depending on the difference between the clamp voltage and the previously held voltage. Such a voltage differential may still result in rippling once the switch is closed.

Such conventional track and hold circuits compensate for offset of the input operational amplifier, but do not account for a varying operating points of the amplifier structure as input voltage is varying. Specifically, the input offset of the amplifier structure may depend on the input voltages. Typically, the offset value and sign is evaluated against a fixed reference level present on the output of the input operational amplifier. This would cause the operating point-dependent offset component to remain uncompensated in such structures, causing the additional distortion of output signal.

Other conventional sample and hold circuit use circuitry that requires one or more additional capacitors beyond the needed hold capacitor in order to eliminate rippling of output signal caused by voltage differential across the switch 603. Capacitors, while small in a simple circuit diagram, may occupy significant layout area in order to provide a reasonable amount of capacitance to efficiently filter the rippling. The presence of additional capacitors may thus significantly increase the size of the resulting circuit and slow down its operation.

Accordingly, what would be advantageous is a track and hold circuit that reduces rippling and compensates offset (including its operating point related component) even if the input voltage varies significantly during the holding phase, and which does not require additional capacitors.

BRIEF SUMMARY OF THE INVENTION

The foregoing problems with the prior state of the art are overcome by the principles of the present invention, which relate to a track and hold or sample and hold offset compensated amplifier structure that performs offset compensation in response to a sign or sign and value of the current flowing from the output of an input amplifier during the holding phase.

The track and hold offset compensated amplifier circuit includes an operational amplifier and an output stage. The operational amplifier receives at its positive input terminal a signal to be tracked. The tracked voltage is provided at the output terminal of the output stage, which represents the output terminal of the entire track and hold or sample and hold circuit.

During the tracking phase, the signal at the output terminal of the output stage is fed back to the negative input terminal of the operational amplifier via a feedback loop, thereby causing the track and hold offset compensated amplifier circuit to have gain that is inversely proportional to the transfer constant of the feedback loop. In addition, the output terminal of the operational amplifier is connected to the input terminal of the output stage circuit. A hold capacitor, connected to the input terminal of the output stage circuit, charges or discharges during the tracking phase, thereby tracking the input signal of the amplifier.

During the holding phase, the charge is maintained across the capacitor, and the output stage circuit provides a relatively constant voltage (i.e., the sampled voltage). Also, the negative feedback between the output stage circuit and the operational amplifier is disconnected, and the positive and negative input terminals of the operational amplifier are connected. There is naturally some offset in the operational amplifier. Accordingly, a direct connection of input terminals of operational amplifier might typically cause its output terminal to clip low or high relative rapidly, due to the high gain of the operational amplifier, thereby causing the accumulation of a voltage differential across the sampling switch. When the sampling switch closes, charge will quickly transfer across the switch. This creates transient events causing substantially rippling in the output signal, resulting in substantial settling time, and reduced sampling speed. Accordingly, the inherent offset of the operational amplifier in the uncompensated track and hold circuit causes error between the input and output voltages of the circuit.

The track and hold offset-compensated amplifier circuit in accordance with the principles of the present invention uses a comparison circuit to compensate for this offset and at the same time to reduce rippling during the transition from the holding phase to the tracking phase. The comparison circuit forces the voltage at the output terminal of the operational amplifier to be the same as the voltage at the input terminal of the output stage circuit during the holding phase and evaluates a value and a sign of the current necessary to reach this state. Based on this comparison, the comparison circuit increases or decreases the voltage differential applied between the positive and negative input terminals of the operational amplifier depending on whether the comparison circuit detects that the current forced to the output of operational amplifier is positive or negative.

This configuration for the track and hold offset-compensated amplifier circuit does not require a capacitor beyond the holding capacitor itself. Capacitors can occupy significant space in the layout of a circuit. By reducing the required capacitors, the overall size of the circuit may be significantly reduced and at the same time dynamic parameters of the structure are not degraded. Furthermore, the track and hold circuit is quite stable. There is no need for the operational amplifier to be in unity gain configuration loaded by non-zeroing capacitors during the holding phase as is present in some of the prior art.

Additional features and advantages of the invention will be set forth in the description that follows, and in part will be obvious from the description, or may be learned by the practice of the invention. The features and advantages of the invention may be realized and obtained by means of the instruments and combinations particularly pointed out in the appended claims. These and other features of the present invention will become more fully apparent from the following description and appended claims, or may be learned by the practice of the invention as set forth hereinafter.

BRIEF DESCRIPTION OF THE DRAWINGS

In order to describe the manner in which the above-recited and other advantages and features of the invention can be obtained, a more particular description of the invention briefly described above will be rendered by reference to specific embodiments thereof which are illustrated in the appended drawings. Understanding that these drawings depict only typical embodiments of the invention and are not therefore to be considered to be limiting of its scope, the invention will be described and explained with additional specificity and detail through the use of the accompanying drawings in which.

DETAILED DESCRIPTION OF THE PREFERRED EMBODIMENTS

The principles of the present invention relate to a track and hold circuit that significantly reduces rippling of the output voltage at the transition from the holding phase to the tracking phase. The track and hold circuit reduces the voltage differential across the sampling switch regardless of offset in the input operational amplifier, and regardless of any fluctuations in the input voltage during the holding phase. Furthermore, this is accomplished without introducing any capacitors that serve to perform the ripple reduction.

Figure 1:
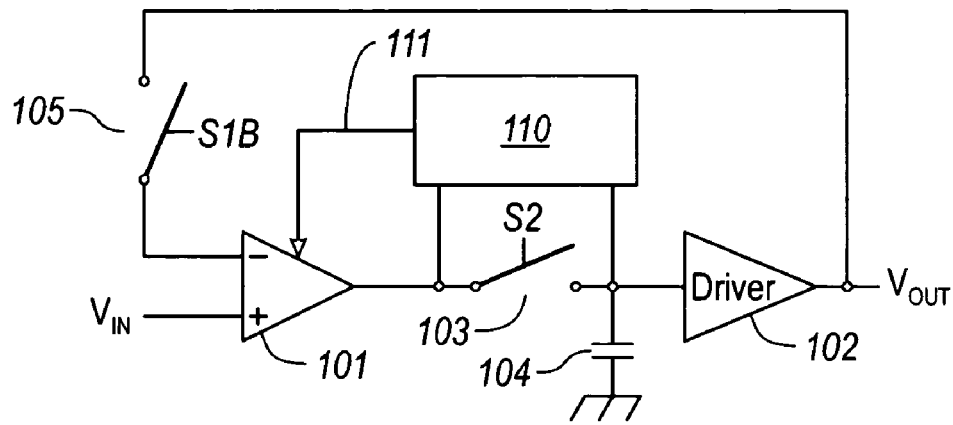
FIG. 1 is a schematic circuit diagram of a track and hold circuit that performance offset compensation using a comparison circuit in accordance with the principles of the present invention.

FIG. 1 is a schematic circuit diagram of a track and hold circuit 100 that performance offset compensation using a comparison circuit in accordance with the principles of the present invention. The track and hold circuit 100 operates cyclically in two phases, a tracking phase in which the output voltage $V_{OUT}$ of the circuit tracks the analog input voltage $V_{IN}$ of the track and hold circuit, and a holding phase in which the circuit provides a constant voltage $V_{OUT}$ that represents the strength of the analog input voltage $V_{IN}$ at a particular instant in time.

In the description and in the claims, a "track and hold" circuit is defined as including sample and hold circuits in which the primary purpose is to hold a sampled value of a varying input signal. In that case, the holding phase may be much longer than the tracking phase. A "track and hold"

circuit is also defined as including circuits (hereinafter referred to as "standard track and hold" circuits) whose primary purpose is to provide an output signal that approximately proportionately tracks an input signal. The use of the term "standard" to describe such track and hold circuits is not implying that all such circuits are known, but the term "standard" is only used to distinguish the typical use of the term "track and hold" circuits from the more expansive definition of "track and hold" circuits used herein, which also include "sample and hold" circuits. Standard track and hold circuits nevertheless still use a holding phase in order to provide offset compensation to allow the output voltage during the tracking phase to more closely align with the input voltage during the tracking phase. In this case, the holding phase may be much shorter than the tracking phase.

Figure 5:
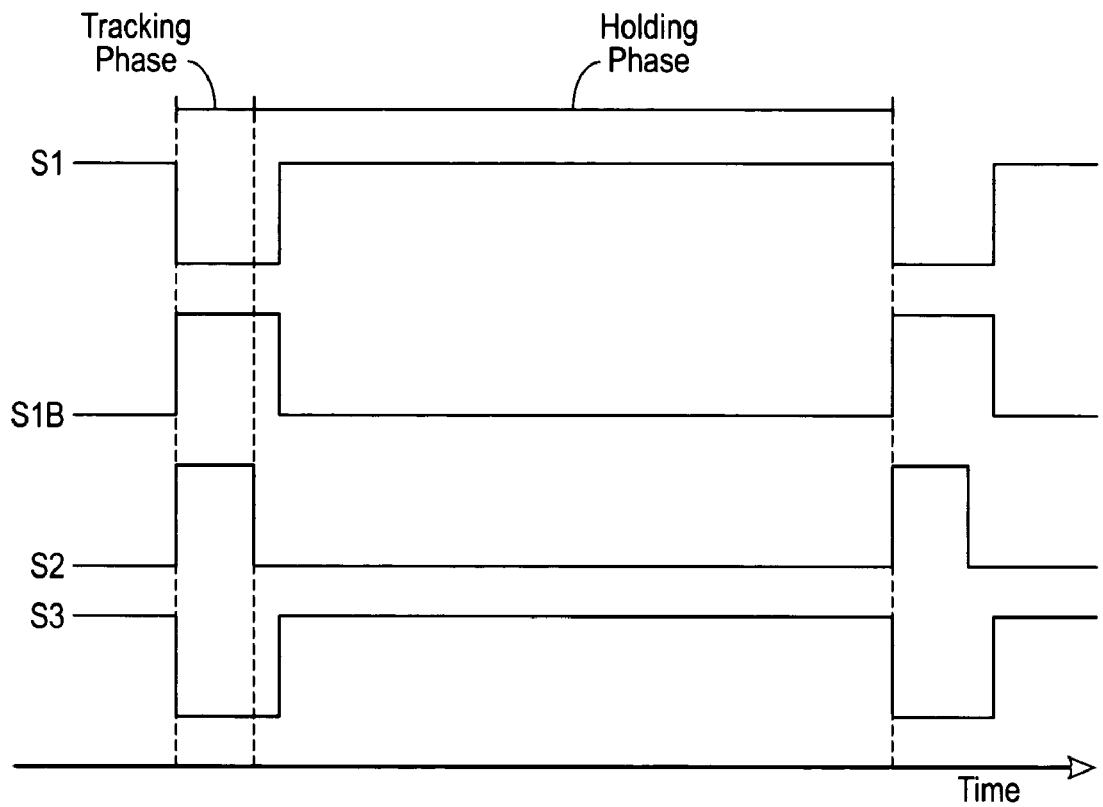
FIG. 5 illustrates a timing diagram for signals controlling the switches illustrated in FIG. 2.
Figure 6:
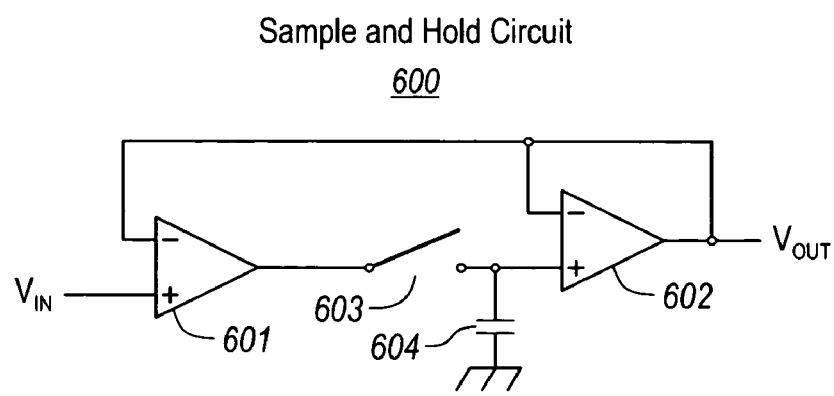
FIG. 6 is a circuit diagram of a conventional track and hold circuit.

Several switches open and close as needed to support the tracking and holding phases. FIG. 5 illustrates a signal timing diagram that shows the switch control signals for the various embodiments illustrated in FIGS. 1 through 3. For clarity in describing the principles of the present invention, the signal timing diagram of FIG. 5 shows the holding phase as extending over a wide horizontal span, despite the fact that in real time, the holding phase will be relatively short in a standard track and hold circuits.

The analog input voltage $V_{IN}$ is provided to the positive terminal of a trans-conductance operational amplifier 101. An output stage circuit 102 selectively receives the voltage provided by the operational amplifier 101 through a sampling switch 103. Specifically, the sampling switch 103 electrically connects the output terminal of the operational amplifier 101 with the input terminal of the output stage circuit 102 during the tracking phase. Conversely, the sampling switch 103 disconnects the output terminal of the operational amplifier 101 from the input terminal of the output stage circuit 102 during the holding phase. Signal S2 shown in FIG. 5 controls the sampling switch 103. The signal S2 is high during the tracking phase thereby closing switch 103, and low during the holding phase thereby opening switch 103. The output of the output stage circuit 102 is the output of the track and hold circuit 100.

A holding capacitor 104 is electrically connected to the input terminal of the output stage circuit 102. During the tracking phase, the holding capacitor 104 charges or discharges so as to have a voltage differential applied across the capacitor 104 that approximately tracks the input voltage $V_{IN}$. This tracking ends when the sampling switch 103 opens, thereby isolating the charge on the capacitor 104 such that the voltage tracked at the time the sampling switch 103 was opened is maintained throughout the holding phase at the input and output terminals of the output stage circuit 102. This holding phase permits offset compensation as will be described further below.

The output terminal of the output stage circuit 102 is selectively electrically connected to the negative input terminal of the operational amplifier 101 through a switch 105. The switch 105 is controlled by control signal S1B illustrated in FIG. 5. The switch 105 is closed during the entire tracking phase thereby ensuring feedback for operational amplifier 101. The switch 105 remains closed slightly into the holding phase to ensure that the sampled voltage is properly captured prior to disconnecting this negative feedback. Slightly into the holding phase, however, the switch 105 is opened.

A comparison circuit 110 evaluates the sign (in the case of binary digital feedback), the sign and a discrete quantized value (in the case of general digital feedback) or the sign and continuous value (in the case of analog feedback) of the current forced to the output of the operational amplifier 101 at least during a portion of the holding phase. In the case of binary digital feedback, the comparison circuit 110 is configured to increase or decrease a voltage differential applied between the positive and negative input terminals of the operational amplifier 101 depending on whether the comparison circuit 110 detects that the current to the output of the operational amplifier 101 is positive or negative. In the case of general digital feedback, the comparision circuit 110 is configured to increase or decrease this input voltage differential, but is also configured such that the magnitude of the increase or decrease depends on the measured quantized value of the current at the output of the operational amplifier 101. This control is symbolized with arrow 111. Specific examples of such a comparison circuit and components thereof will be illustrated in FIGS. 2, 3 and 4A through 4C.

As just described, the track and hold circuit 100 realizes a digital feedback loop for offset compensation. As also mentioned, however, the track and hold circuit 100 also may realize an analog feedback loop, in which the voltage differential across the input terminals of the operational amplifier are not simply a function of the whether the current forced to the ouput terminal of the operational amplifier 101 is positive or negative, but may also be a function of the magnitude of such current. Such an analog feedback loop would result in increased accuracy of offset compensation, since the feedback is not restricted to discrete levels of input voltage differentials, and since the offset compensation would have a faster reaction speed.

Figure 2:
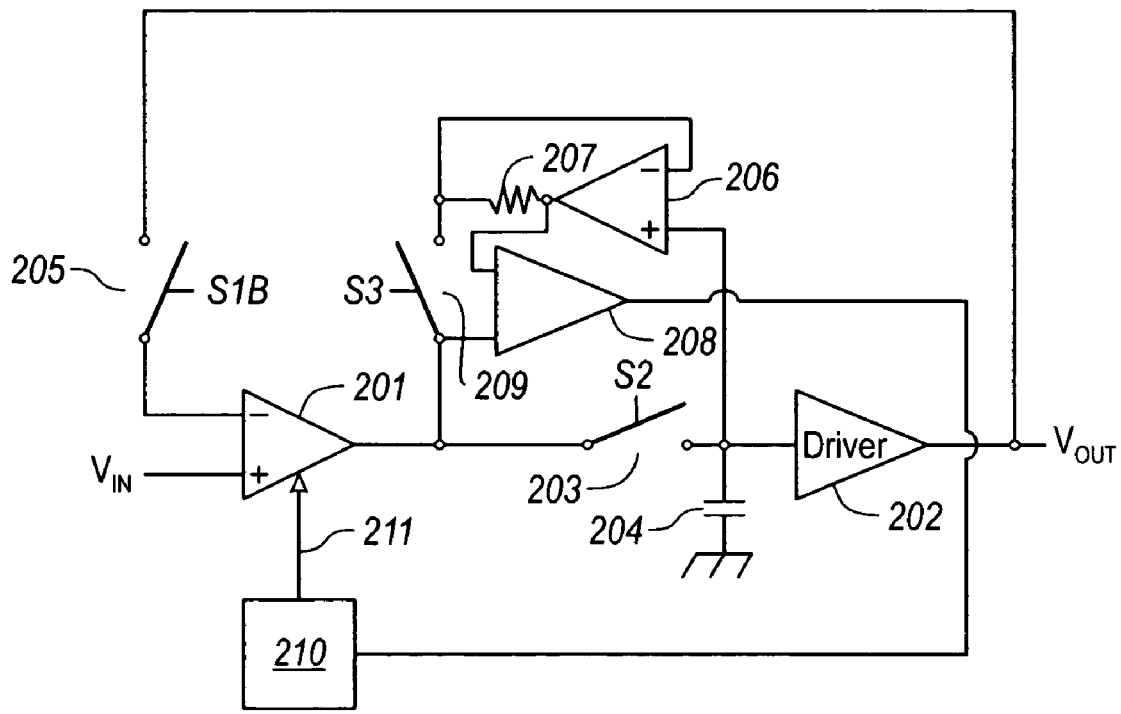
FIG. 2 is a schematic circuit diagram of an embodiment of the track and hold circuit in which further components of the comparison circuit are illustrated including a voltage adjustment circuit responsive to the sign of current forced to the output of operational amplifier in accordance with the principles of the present invention.

FIG. 2 illustrates a track and hold circuit 200, which has a few components that are similar to the components of the track and hold circuit 100 of FIG. 1. Specifically, the operational amplifier 201, the output stage circuit 202, the sampling switch 203, the holding capacitor 204 and the feedback switch 205 may be similar to the components 101 through 105, respectively described above with respect to FIG. 1. However, instead of showing a generic comparison circuit, components 206 through 210 represent specific components suitable for the comparison circuit 110 described above with respect to FIG. 1.

Specifically, a second operational amplifier 206 has its positive input terminal electrically connected to the input terminal of the output stage circuit 202. The negative input terminal of the operational amplifier 206 is coupled to its own output terminal via a resistor 207 used as a current sensing element. An evaluation circuit 208 evaluates the sign and possible also the value of the current across the resistor 207. In binary feedback, the evaluation circuit 208 may be, for example, a comparator, which provides one of two binary output signals depending on the sign of the current across the resistor 207. In general digital feedback, the evaluation circuit 208 may be a quantizer, which outputs of more than two discrete values depending on the sign and value of the current across the resistor 207. In the case of analog feedback, the evaluation circuit 208 may be an amplifier. The resistor 207 is selectively coupled to the output terminal of the operational amplifier 201 via switch 209, which is controlled by control signal S3 represented in FIG. 5.

During the tracking phase, switch 209 is open. In this configuration, there is negligible current flow across resistor 207. However, during much, if not all, of the holding phase, the switch 209 is closed. In that configuration, the voltages at each side of the sampling switch 203 are forced to be the same by means of the operational amplifier 206. With the operational amplifier 206 in unity gain configuration as shown, the voltage at the output stage side of the sampling switch 203 will be provided at the output terminal of the operational amplifier 206. The voltage difference across the resistor 207 thus has a polarity and value that reflects the polarity and value of the current necessary to keep the output of the operational amplifier 201 at the voltage present on storage capacitor 204. This current is directly proportional to the offset of input operational amplifier if the input operational amplifier is a trans-conductance amplifier. The evaluation circuit 208 senses the current polarity (and potentially also the current magnitude) as a voltage differential over resistor 207 and provides a signal that depends on the polarity to a voltage adjustment circuit 210.

The voltage adjustment circuit 210 then adjusts (as represented symbolically by arrow 211) the voltage differential applied between the input terminals of the operational amplifier 201 depending on the polarity (or polarity and value in the case of more general digital feedback and analog feedback) of the voltage across the resistor 207. Specifically, in the case of binary digital feedback, the voltage adjustment circuit 210 reduces the input voltage differential (V+ minus V−) between the voltage present at the positive input terminal of the first operational amplifier 201 and the voltage present at the negative input terminal of the first operational amplifier 201 if the comparator 208 detects that the voltage at the right terminal of the resistor 207 is less than the voltage at the left terminal of the resistor 207, and increases the difference if the comparator detects that the voltage at the left terminal of the resistor is less than the voltage at the right terminal of the resistor.

In that configuration, the voltage difference across the sampling switch 203 will tend towards zero during the holding phase, regardless of any offset in the operational amplifier 201, and regardless of any transient different between the input voltage $V_{IN}$ and the sample voltage $V_{OUT}$ that may occur during the holding phase. Accordingly, when the sampling switch 203 closes at the beginning of the next tracking phase, there is little charge redistribution, thereby reducing rippling of the tracking output signal. This improves accuracy and/or operational speed of the track and hold process.

Figure 3:
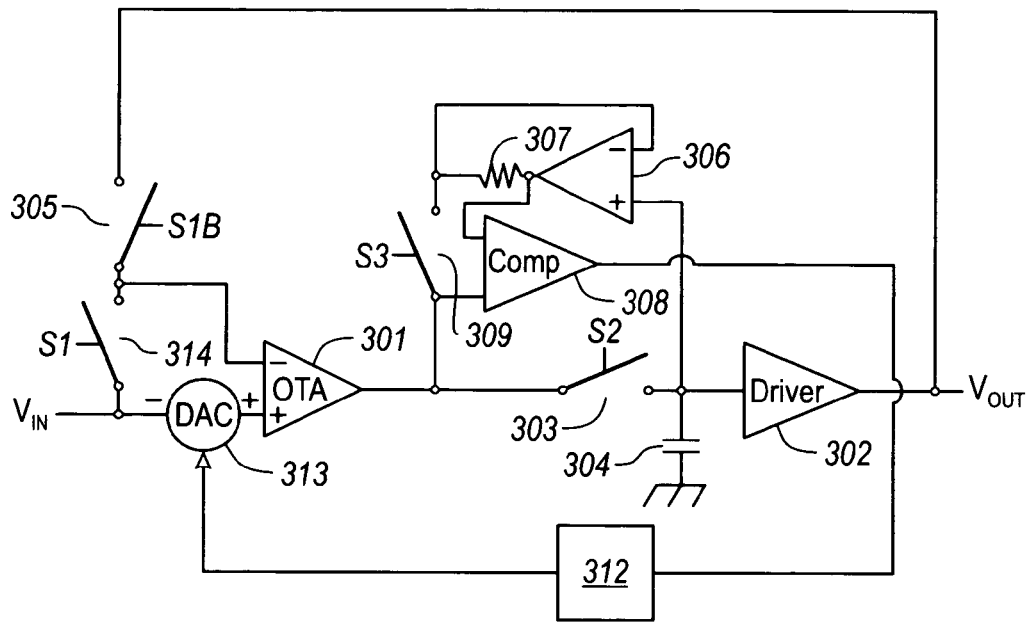
FIG. 3 is a circuit diagram of an embodiment of the track and hold circuit of FIG. 2 in which more components of one embodiment of the voltage adjustment circuit are shown.

FIG. 3 illustrates an even more specific embodiment of a track and hold circuit 300 in accordance with the principles of the present invention. In this embodiment, components 301 through 309 may be similar to components 201 through 209, respectively, described above with respect to FIG. 2. However components 312, 313 and 314 correspond to an embodiment of the voltage adjustment circuit 210 of FIG. 2.

Referring to FIG. 3, a digital value generator 312 is electrically connected to the output terminal of the evaluation circuit, which in the case of FIG. 3, is a comparator 308. The digital value generated by the digital value generator decreases if the comparator 308 detects that the voltage at the right terminal of the resistor 307 is less than the voltage at the second terminal of the resistor 307, and increases if the comparator 308 detects that the voltage at the right terminal of the resistor 307 is greater than the voltage at the left terminal of the resistor 307. For multiple digital values, the digital value generator 312 may adjust amount of increase or decrease of the discrete digital value based on the output of a comparator that quantizes multiple regions of current flow across the resistor 307. Once again, for analog feedback compensation of offset, the comparator 308 may be replaced by an amplifier.

In the case of digital feedback offset compensation, a digital-to-analog converter 313 has an input terminal that receives the digital value provided by the digital value generator 312. The digital-to-analog converter 313 applies a voltage difference between the positive and the negative input terminal of the input trans-conductance amplifier 301 in approximate proportion to the digital value applied at the input terminal of the digital-to-analog converter 313. In case of analog offset compensation feedback loop, the digital-to-analog converter 313 is replaced by analog voltage memory element, realized for example as a sample and hold circuit, converting the amplified voltage differential on resistor 307 to voltage difference between the positive and the negative input terminal of the input trans-conductance amplifier 301. In that case, the digital value generator 312 would be replaced by a closed circuit.

In the configuration of FIG. 3, the positive output terminal of the digital-to-analog converter 313 is electrically connected to the positive input terminal of the operational amplifier 301. A switch 314 controlled by signal S1 of FIG. 5 electrically connects the negative input terminal of the operational amplifier 301 with the negative output terminal of the digital-to-analog converter 313.

Figure 4A:
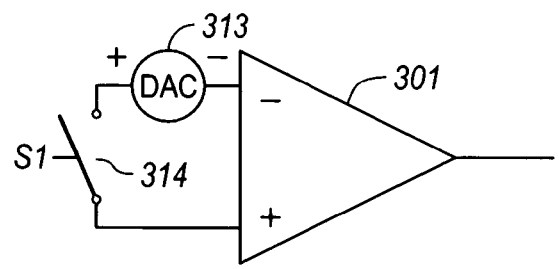
FIG. 4A is a diagram of second embodiment of the voltage adjustment circuit of FIG. 2 in conjunction with the input operational amplifier.
Figure 4B:
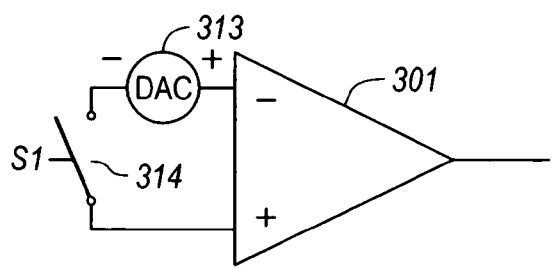
FIG. 4B is a diagram of third embodiment of the voltage adjustment circuit of FIG. 2 in conjunction with the input operational amplifier.
Figure 4C:
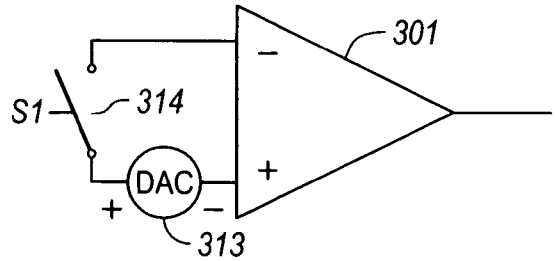
FIG. 4C is a diagram of fourth embodiment of the voltage adjustment circuit of FIG. 2 in conjunction with the input operational amplifier.

During the holding phase, the switch 314 is closed. The digital-to-analog converter 313 will work to adjust the voltage differential across the input terminals of the operational amplifier 301 so that the output voltage of the operational amplifier 301 tends towards the held voltage. In other words, the voltage differential across resistor 307, reflecting offset of input trans-impedance amplifier 301 is regulated toward zero during the holding phase. FIG. 4A illustrates an alternative configuration for the digital-to-analog converter 313 and operational amplifier 301 of FIG. 3. FIGS. 4B and 4C are alternative configurations should the digital value provided to the digital-to-converter 313 be configured to increase if the comparator 308 detects that the voltage at the right terminal of the resistor 307 is less than the voltage at the left terminal of the resistor 307, and decrease if the comparator 308 detects that the voltage at the right terminal of the resistor 307 is greater than the voltage at the left terminal of the resistor 307.

Accordingly, the principles of the present invention provide a track and hold offset-compensated amplifier circuit that reduces rippling at the onset of the holding phase and mainly at the onset of the tracking phase, and that does not require an additional capacitor to reduce the rippling. The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes, which come within the meaning and range of equivalency of the claims, are to be embraced within their scope.

What is claimed and desired secured by United States Letters Patent is:

1. A track and hold offset compensated amplifier circuit configured to operate in a tracking phase and a holding phase, the track and hold circuit comprising:

a trans-conductance operational amplifier, having a positive input terminal, a negative input terminal and an output terminal;

an output stage circuit having an input terminal and an output terminal, wherein the output terminal of the output stage circuit is selectively electrically connected to the negative input terminal of the operational amplifier during the tracking phase;

a sampling switch configured to electrically connect the output terminal of the operational amplifier with the input terminal of the output stage circuit during the tracking phase, and configured to electrically disconnect the output terminal of the operational amplifier from the input terminal of the output stage circuit during the holding phase;

a capacitor electrically connected to the input terminal of the output stage circuit so as to charge or discharge during the tracking phase, and so as to hold charge relatively constant during the holding phase; and a comparison circuit configured to evaluate a sign or sign and value of the current at the output terminal of the trans-conductance operational amplifier when kept at the potential of the input terminal of the output stage circuit at least during a portion of the holding phase, wherein the comparison circuit is further configured to increase or decrease a voltage differential applied between the positive and negative input terminals of the trans-conductance operational amplifier depending on a result of the evaluation of the comparison circuit.

2. A track and hold offset compensated amplifier circuit in accordance with claim 1, wherein the operational amplifier is a first operational amplifier, the comparison circuit comprising:

a second operational amplifier having a negative input terminal, a positive input terminal, and an output terminal, wherein the positive input terminal of the second operational amplifier is electrically connected to the input terminal of the output stage circuit;

a resistor having a first terminal and a second terminal, the first terminal of the resistor being electrically connected to the output terminal of the second operational amplifier, the second terminal of the resistor being coupled to the negative input terminal of the second operational amplifier;

a comparator having first and second input terminals and an output terminal, the first input terminal of the comparator being electrically connected to the first terminal of the resistor, and the second input terminal of the comparator being electrically connected to the second terminal of the resistor, wherein the second terminal of the resistor is selectively coupled to the output terminal of the first operational amplifier during the portion of the holding phase; and a voltage adjustment circuit configured to reduce the difference between the voltage present at the positive input terminal of the first operational amplifier and the voltage present at the negative input terminal of the first operational amplifier if the comparator detects that the voltage at the first terminal of the resistor is less than the voltage at the second terminal of the resistors, and configured to increase the difference if the comparator detects that the voltage at the first terminal of the resistor is greater than the voltage at the second terminal of the resistor.

3. A track and hold offset compensated amplifier circuit in accordance with claim 2, wherein the voltage adjustment circuit comprises:

a digital value generator electrically connected to the output terminal of the comparator, wherein a digital value generated by the digital value generator decreases if the comparator detects that the voltage at the first terminal of the resistor is less than the voltage at the second terminal of the resistors, and increases if the comparator detects that the voltage at the first terminal of the resistor is greater than the voltage at the second terminal of the resistor, and a digital-to-analog converter having an input terminal, a positive output terminal, and a negative output terminal, the digital-to-analog converter configured to apply a voltage difference between the positive input terminal of the digital-to-analog converter and the negative input terminal of the digital-to-analog converter in approximate proportion to a digital value applied at the input terminal of the digital-to-analog configured, wherein the input terminal of the digital-to-analog converter is electrically connected to the digital value generator so as to receive the digital value generated by the digital value generator, wherein the positive output terminal of the digital-to-analog converter is electrically connected to the positive input terminal of the first operational amplifier; and a switch electrically connecting the negative input terminal of the first operational amplifier with the negative output terminal of the digital-to-analog converter.

4. A track and hold offset compensated amplifier circuit in accordance with claim 2, wherein the voltage adjustment circuit comprises:

a digital value generator electrically connected to the output terminal of the comparator, wherein a digital value generated by the digital value generator decreases if the comparator detects that the voltage at the first terminal of the resistor is less than the voltage at the second terminal of the resistors, and increases if the comparator detects that the voltage at the first terminal of the resistor is greater than the voltage at the second terminal of the resistor; and a digital-to-analog converter having an input terminal, a positive output terminal, and a negative output terminal, the digital-to-analog converter configured to apply a voltage difference between the positive input terminal of the digital-to-analog converter and the negative input terminal of the digital-to-analog converter in approximate proportion to a digital value applied at the input terminal of the digital-to-analog configured, wherein the input terminal of the digital-to-analog converter is electrically connected to the digital value generator so as to receive the digital value generated by the digital value generator, wherein the negative output terminal of the digital-to-analog converter is electrically connected to the negative input terminal of the first operational amplifier; and a switch electrically connecting the positive input terminal of the first operational amplifier with the positive output terminal of the digital-to-analog converter.

5. A track and hold offset compensated amplifier circuit in accordance with claim 2, wherein the voltage adjustment circuit comprises:

a digital value generator electrically connected to the output terminal of the comparator, wherein a digital value generated by the digital value generator increase if the comparator detects that the voltage at the first terminal of the resistor is less than the voltage at the second terminal of the resistors, and decreases if the comparator detects that the voltage at the first terminal of the resistor is greater than the voltage at the second terminal of the resistor; and a digital-to-analog converter having an input terminal, a positive output terminal, and a negative output terminal, the digital-to-analog converter configured to apply a voltage difference between the positive input terminal of the digital-to-analog converter and the negative input terminal of the digital-to-analog converter in approximate proportion to a digital value applied at the input terminal of the digital-to-analog configured, wherein the input terminal of the digital-to-analog converter is electrically connected to the digital value generator so as to receive the digital value generated by the digital value generator, wherein the negative output terminal of the digital-to-analog converter is electrically connected to the positive input terminal of the first operational amplifier; and a switch electrically connecting the negative input terminal of the first operational amplifier with the positive output terminal of the digital-to-analog converter.

6. A track and hold offset compensated amplifier circuit in accordance with claim 2, wherein the voltage adjustment circuit comprises:

a digital value generator electrically connected to the output terminal of the comparator, wherein a digital value generated by the digital value generator increases if the comparator detects that the voltage at the first terminal of the resistor is less than the voltage at the second terminal of the resistors, and decreases if the comparator detects that the voltage at the first terminal of the resistor is greater than the voltage at the second terminal of the resistor; and a digital-to-analog converter having an input terminal, a positive output terminal, and a negative output terminal, the digital-to-analog converter configured to apply a voltage difference between the positive input terminal of the digital-to-analog converter and the negative input terminal of the digital-to-analog converter in approximate proportion to a digital value applied at the input terminal of the digital-to-analog configured, wherein the input terminal of the digital-to-analog converter is electrically connected to the digital value generator so as to receive the digital value generated by the digital value generator, wherein the positive output terminal of the digital-to-analog converter is electrically connected to the negative input terminal of the first operational amplifier; and a switch electrically connecting the positive input terminal of the first operational amplifier with the negative output terminal of the digital-to-analog converter.

7. A track and hold offset compensated amplifier circuit in accordance with claim 1, wherein the comparison circuit is configured to evaluate a sign and value of the current at the output terminal of the trans-conductance operational amplifier when kept at the potential of the input terminal of the output stage circuit at least during a portion of the holding phase, where a magnitude of increase or decrease of the voltage differential applied between the positive and negative input terminals of the trans-conductance operational amplifier is a function of the evaluated value of the current at the output terminal of the trans-conductance operational amplifier.

8. A track and hold offset compensated amplifier circuit in accordance with claim 2, wherein the operational amplifier is a first operational amplifier, the comparison circuit comprising:

a second operational amplifier having a negative input terminal, a positive input terminal, and an output terminal, wherein the positive input terminal of the second operational amplifier is electrically connected to the input terminal of the output stage circuit;

a resistor having a first terminal and a second terminal, the first terminal of the resistor being electrically connected to the output terminal of the second operational amplifier, the second terminal of the resistor being coupled to the negative input terminal of the second operational amplifier;

a quantizer having first and second input terminals and an output terminal, the first input terminal of the quantizer being electrically connected to the first terminal of the resistor, and the second input terminal of the quantizer being electrically connected to the second terminal of the resistor, wherein the second terminal of the resistor is selectively coupled to the output terminal of the first operational amplifier during the portion of the holding phase; and a voltage adjustment circuit configured to adjust the difference between the voltage present at the positive input terminal of the first operational amplifier and the voltage present at the negative input terminal of the first operational amplifier depending on the sign and value of the current through the resistor detected by the quantizer.

9. A track and hold offset compensated amplifier circuit in accordance with claim 2, wherein the operational amplifier is a first operational amplifier, the comparison circuit comprising:

a second operational amplifier having a negative input terminal, a positive input terminal, and an output terminal, wherein the positive input terminal of the second operational amplifier is electrically connected to the input terminal of the output stage circuit;

a resistor having a first terminal and a second terminal, the first terminal of the resistor being electrically connected to the output terminal of the second operational amplifier, the second terminal of the resistor being coupled to the negative input terminal of the second operational amplifier;

an amplifier having first and second input terminals and an output terminal, the first input terminal of the amplifier being electrically connected to the first terminal of the resistor, and the second input terminal of the amplifier being electrically connected to the second terminal of the resistor, wherein the second terminal of the resistor is selectively coupled to the output terminal of the first operational amplifier during the portion of the holding phase; and a voltage adjustment circuit configured to adjust the difference between the voltage present at the positive input terminal of the first operational amplifier and the voltage present at the negative input terminal of the first operational amplifier depending on the sign and value of the current through the resistor detected by the amplifier.

* * * * *